United States Patent [19]

Asars

[11] Patent Number: 4,540,937
[45] Date of Patent: Sep. 10, 1985

[54] ELECTRONIC CIRCUITRY WITH SELF-CALIBRATING FEEDBACK FOR USE WITH AN OPTICAL CURRENT SENSOR

[75] Inventor: Juris A. Asars, Murrysville, Pa.

[73] Assignee: Westinghouse Electric Corp., Pittsburgh, Pa.

[21] Appl. No.: 502,026

[22] Filed: Jun. 7, 1983

[51] Int. Cl.³ .................. G01R 19/00; G01R 1/02
[52] U.S. Cl. .................. 324/96; 324/117 R; 324/130; 350/376
[58] Field of Search .................. 324/96, 117 R, 130; 350/375, 376, 377, 356

[56] References Cited

U.S. PATENT DOCUMENTS 3,778,710 12/1973 Snook .................. 324/130
4,363,061 12/1982 Vaerewyck et al. .................. 324/96

Primary Examiner—Ernest F. Karlsen
Attorney, Agent, or Firm—M. J. Moran

[57] ABSTRACT

There is provided by this invention an electronic circuit for interfacing with a magneto-optical current sensor employing the Faraday effect to measure current in a high voltage transmission line. A DC biasing voltage is applied to the output of a photodetector to substantially eliminate the DC component providing a substantially AC output signal to the circuit. There is also provided a negative low pass error feedback to self-calibrate the circuit.

2 Claims, 2 Drawing Figures

ELECTRONIC CIRCUITRY WITH SELF-CALIBRATING FEEDBACK FOR USE WITH AN OPTICAL CURRENT SENSOR

BACKGROUND OF THE INVENTION

This invention relates generally to electronic control circuits used as an interface with magneto-optical current sensors that employ the Faraday effect for measuring currents in high voltage transmission lines. More specifically, this invention relates to self-calibrating feedback control circuits that insure constant effective DC components of emerging light intensity free from low frequency variations in light transmission, LED efficiency, or PIN diode radiant sensitivity. With a constant DC component of light intensity, the AC component is directly proportional to the conductor current in the linear range thereby calibrating the sensor.

A common requirement in the application of fiber optical technology is the stabilization of the LED light source to minimize the effects of temperature changes, aging, and radiant sensitivity. In most applications this is accomplished by adding a feedback circuit using the control signal to compensate for drift that may result from these undesirable circuit characteristics.

SUMMARY OF THE INVENTION

There is provided by this invention a closed feedback loop system for stabilizing and calibrating the magneto-optical current sensor that substantially eliminates all DC components from the output of the photodetectors prior to preamplification of the signal by the electronic interface. Elimination of the DC component allows the interface circuit to transform the output signal into a calibrated signal having a large dynamic range as well as excellent temporal and thermal stability to meet the requirements for most metering, protection, and control applications. In addition to maximizing the dynamic range, amplification of only an AC signal is less demanding on the stability requirements for the operational amplifiers utilized in the circuit.

DESCRIPTION OF THE PREFERRED EMBODIMENT

Figure 1:
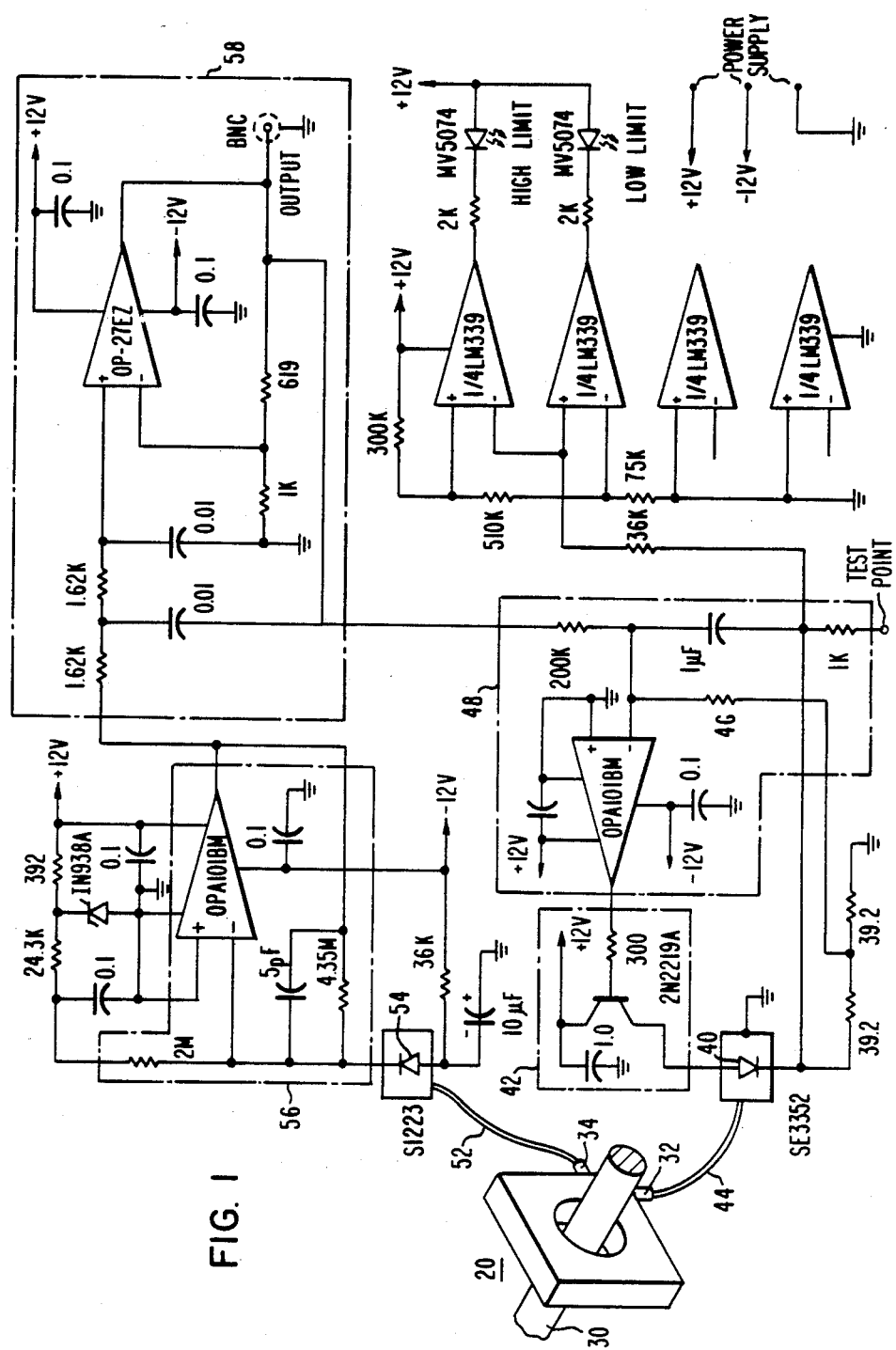
FIG. 1 is a control schematic incorporating the principles of this invention.

There is shown in FIG. 1 a magneto-optical current sensor 20 for measuring the current in a currentcarrying conductor 30. An LED light source 40 supplies light to the polarizer 32 of the magneto-optical current sensor 20 by means of fiber optical cable 44 for modulation by the current in the current-carrying conductor 30. The modulated output of the analyzer 34 of the magneto-optical current sensor 20 is connected to a photodetector 54 by means of an optical cable 52. The output of the photodetector 54 is biased by a 12 volt bias supply. A calibrating current through a 2M resistor elminates the DC component of the photodector's output and the resulting small AC signal is supplied to a low noise preamplifier 56 for amplification. The amplified signal is supplied to a low pass filter 58 to eliminate all high frequencies above approximately 10 KHz. The output of the low pass filter is utilized for metering and other control application. The output of the low pass filter 58 is also fed back to a low pass filter 48 which filters out all frequencies above 3 cycles resulting in an error feedback signal. The error feedback signal is then supplied to a current source 42 which biases the LED light source 40 to automatically calibrate the light intensity to ensure that the emerging DC component of light is free from low frequency variations, light transmissions, LED efficiency, and radiant sensitivity.

It has been determined that a calibration constant of 0.75 millivolts output per ampere in the conductor can be attained for this circuit in conjunction with a closed form Faraday rotation magneto-optical current sensor. A 60 microsecond 10% to 90% rise time in response to a step function in conductor current as well as frequency response has been measured. For this bandwidth the output noise level is approximately 0.6 millivolts (rms) which corresponds to a conductor moise current of 0.8 amperes (rms). With a full scale conductor current of approximately 10,000 amperes (rms) the full scale to noise current ratio for this system is over 12,000 for this bandwidth. This dynamic range can be increased by reducing the bandwidth of the electronic interface or by increasing the light intensity in the magneto-optic current because the noise is almost entirely due to shot noise in the PIN diode.

Figure 2:
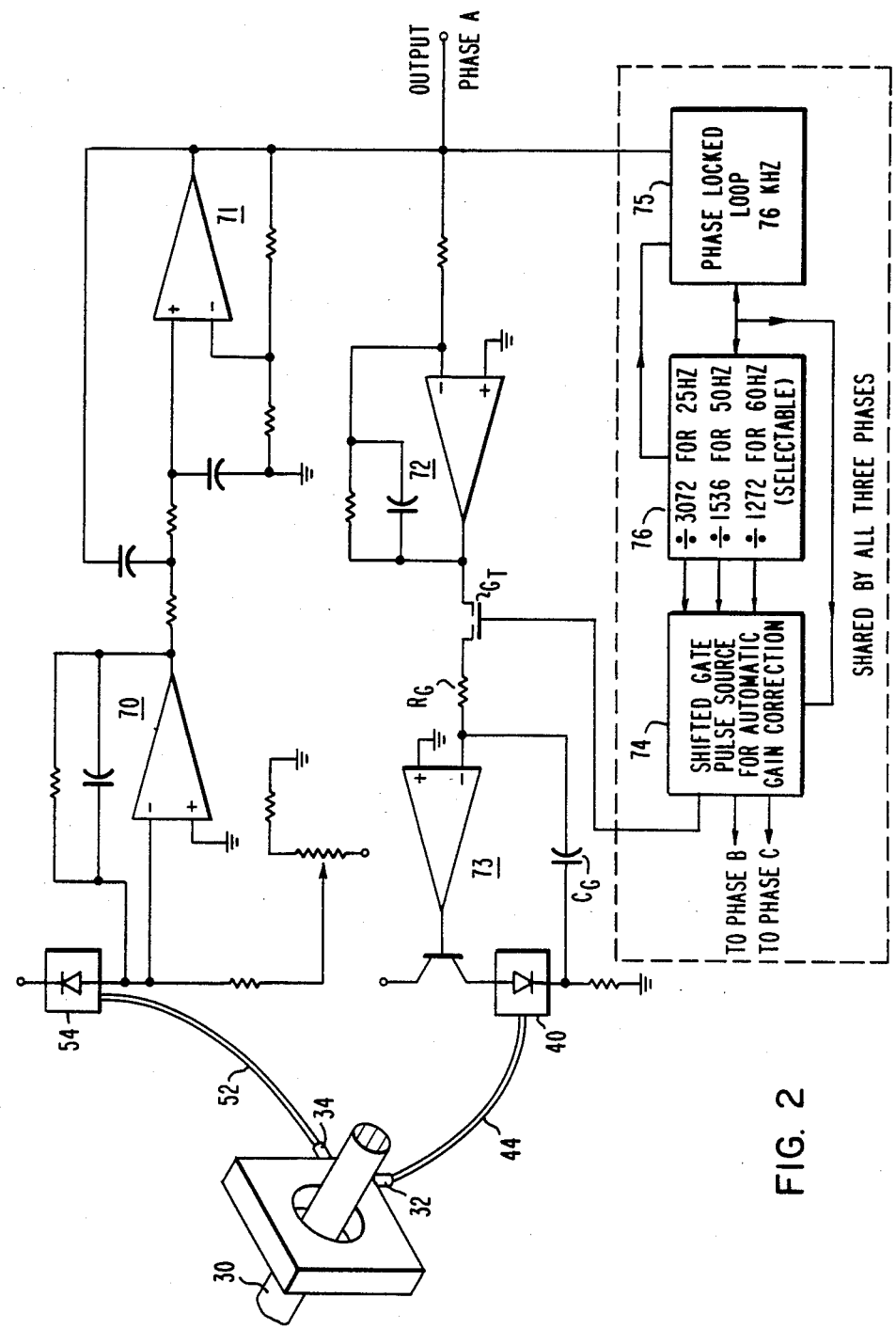
FIG. 2 is a typical control schematic for a three-phase system incorporating the principles of this invention.

Referring to FIG. 2 there is shown a typical schematic for one phase of a three phase current sensor. As in the single phase interface, the four amplifiers in each phase of the three phase circuit together with the corresponding optical sensor form a low pass negative feedback loop which maintains a constant DC component in the PIN diode for frequencies below the region of interest. As in the single phase interface circuit, with constant DC component of the emerging light intensity, the AC component of the light intensity in the linear range is directly proportional to the intantaneous conductor current. This component is detected and amplified by the low noise preamplifier 70 to produce an output voltage proportional to the instantaneous conductor current with high frequency components removed by the low pass filter 71. While a single low pass filter-amplifier was used between the output and the LED driver in the single phase interface circuit, each phase of the three phase circuit utilizes a low pass filter amplifier 72 followed by an error pulse integrator 73 for maintaining a zero average output voltage as well as a constant PIN diode DC current component. The low pass filter amplifier 73 output is sampled by an automatic gain circuit 74 with short 13 mircosecond pulses at twice the signal frequency rate close to its zero crossing points. While these pulses are obtained from a single phase locked loop 75 via a frequency selector 76 common to all three phases in this case, separate sampling pulse sources could be used for each phase. The gain correction produced by each of the proportional error pulses as well as the low frequency response of the interface circuit is determined by the resistor $R_G$ in series with the sampling gate $G_T$ and the value of the integrating capacitor $C_G$.

A second feature of this gain correction method is its ability to maintain the interface circuit calibration during short power interrupt periods. Under such periods, the sample gate pulses are inhibited and the charge on the integrating capacitor $C_G$ is retained even in complete absence of power for the interface circuit. On restoration of the power, calibration is reestablished in less than one signal period.

Although there has been illustrated and described a specific structure, it is to be clearly understood that the same were merely for purposes of illustration by those skilled in the art without departing from the spirit and the scope of this invention.

I claim:

1. A magneto-optical electrical current measuring system, comprising:

a calibrated polarized light source, said light source being susceptible of low frequency variation in intensity;

magneto-optical electrical current sensor means disposed to measure electrical current in an electrical conductor by magnetically modulating the polarization angle of polarized light passed therethrough in response to changes in said current, said polarized light coming from said polarized light source;

circuit means connected to said magneto-optical electrical current sensing means for converting the modulated polarized light into a useful electric signal; and low pass filter means connected to the output of said circuit means for extracting therefrom that portion of said electric signal related to said low frequency variation in the intensity, the output of such low pass filter means being negatively fed back to said calibrated polarized light source for cooperating therewith to tend to reduce said low frequency variation in intensity to thus cause the intensity of said polarized light source to a constant value so that said modulated polarized light from said magneto-optical current sensor means tends to contain information only about said changes in said electric current.

2. The combination as claimed in claim 1 comprising means for maintaining the calibration of the intensity of said polarized light source after an electrical power interruption for said calibrated polarized light source.

* * * * *